(12) United States Patent
Choi et al.

(10) Patent No.: US 6,627,322 B2
(45) Date of Patent: Sep. 30, 2003

(54) FUNCTIONAL FILM HAVING OPTICAL AND ELECTRICAL PROPERTIES

(75) Inventors: Chaun-gi Choi, Suwon (KR); Young-rag Do, Seoul (KR); Joon-bae Lee, Yongin (KR); Chang-won Park, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 09/994,768

(22) Filed: Nov. 28, 2001

(65) Prior Publication Data

US 2002/0146570 A1 Oct. 10, 2002

(30) Foreign Application Priority Data

Feb. 7, 2001 (KR) .......................................... 2001-5939

(51) Int. Cl.$^7$ ................................................ B32B 15/04
(52) U.S. Cl. ..................... 428/469; 428/1.51; 428/1.52; 428/428; 428/432; 428/448; 428/450; 428/697; 428/702
(58) Field of Search ................................. 428/1.51, 1.52, 428/1.62, 428, 432, 448, 450, 469, 472, 697, 699, 701, 702

(56) References Cited

U.S. PATENT DOCUMENTS

| 4,243,735 A | 1/1981 | Kobale et al. |
| 5,808,714 A | 9/1998 | Rowlands et al. |
| 5,827,409 A | * 10/1998 | Iwata et al. ............. 204/192.15 |
| 5,976,639 A | 11/1999 | Iwata |
| 6,387,576 B2 | * 5/2002 | Indutnyy Z. et al. ....... 313/470 |

FOREIGN PATENT DOCUMENTS

| EP | 1 045 727 | 10/2000 |
| GB | 2284431 A | 6/1995 |

OTHER PUBLICATIONS

WPI abstract of JP 580060166 A and JP 580060166 A (Apr. 9, 1983).
U.S. patent application Ser. No. 09/741,108, Indutnyy et al., filed Dec. 21, 2000.
U.S. patent application Ser. No. 09/994,786, Choi et al., filed Nov. 28, 2001.
U.S. patent application Ser. No. 09/994,623, Choi et al., filed Nov. 28, 2001.

* cited by examiner

Primary Examiner—Deborah Jones
Assistant Examiner—Andrew T Piziali
(74) Attorney, Agent, or Firm—Staas & Halsey LLP

(57) ABSTRACT

A functional film includes a transition layer having a first constituent and a second constituent having gradual content gradients according to a thickness of the functional film. The first constituent is at least one dielectric material selected from the group consisting of $SiO_x$ (x>1), $MgF_2$, $CaF_2$, $Al_2O_3$, $SnO_2$, $In_2O_3$ and ITO, and the second constituent is at least one material selected from the group consisting of iron (Fe), cobalt (Co), titanium (Ti), vanadium (V), aluminum (Al), silver (Ag), silicon (Si), germanium (Ge), yttrium (Y), zinc (Zn), zirconium (Zr), tungsten (W) and tantalum (Ta).

33 Claims, 3 Drawing Sheets

FUNCTIONAL FILM HAVING OPTICAL AND ELECTRICAL PROPERTIES

CROSS-REFERENCE TO RELATED APPLICATIONS

This application claims the benefit of Korean Application No. 2001-5939, filed Feb. 7, 2001, in the Korean Industrial Property Office, the disclosure of which is incorporated herein by reference.

BACKGROUND OF THE INVENTION

1. Field of the Invention

The present invention relates to a functional film, and more particularly, to a functional film having adjustable optical and electrical properties.

2. Description of the Related Art

A functional film having electrical conductivity while minimizing reflectance of external light has a variety of applications. These applications include sun glasses, external light shielding glass, UV protective and insulating materials or electromagnetic shielding materials.

The functional film is also used as a black matrix formed between phosphor layers of a color display device, such as a color cathode ray tube. In this context, the functional film absorbs the external light and the light scattered from adjacent phosphor layer patterns. If the reflectance of the external light of a screen of a display device increases, a visible image becomes blurred. Since the external light is reflected mainly at a black matrix of the screen, attempts to improve luminance and contrast by increasing the absorbance of the black matrix surrounding pixels of the display device have been continuously made. Thus, a black matrix is fabricated to have a laminated film structure using chromium, and more specifically, using a film consisting of a chromium layer and a chromium oxide layer. In order to further increase the absorptivity of the black matrix, carbon may be added to the chromium oxide layer.

U.S. Pat. No. 5,976,639 discloses a method of forming a black matrix for a liquid crystal display using a laminated film consisting of a transition layer and a metal layer on the inner surface of a display panel. According to this patent, the laminated film has a transition layer in which the content of one constituent element, such as Cr, W, Ta, Ti, Fe, Ni or Mo, increases approximately between 0.5% to 20% per 100 Å in the incident direction of external light. The transition layer may further include a constituent element such as oxygen, nitrogen or carbon. The metal element is desirably chromium. The transition layer is disposed between a low metal layer and a high metal layer. The content of metal elements of the high metal layer is in the range of 50% to 100% by weight. The content of metal elements of the low metal layer is in the range of 10% to 50% by weight. The low metal layer is not the essential constituent from the viewpoint of the function of a black matrix.

The black matrix is manufactured by a reactive sputtering method in which a metal (chromium) target is placed on a magnetron cathode in a vacuum chamber, a first gas is introduced into the chamber for magnetron discharging, and a second gas, (i.e., a reactive gas such as oxygen or nitrogen to react with the sputter metal elements) is introduced into the chamber. Sputtering is performed at an atmosphere in which the partial pressure of the reactive gas gradually decreases in the moving direction of a transparent substrate.

However, in the black matrix and preparation method thereof described in U.S. Pat. No. 5,976,639, materials that are environmentally detrimental such as chromium, are used, and the deposition should be performed at a reactive atmosphere. Also, during formation of the transition layer and the metal layer in the laminated film, the composition and thickness of each layer must be strictly controlled so as to make the manufacturing process complex.

SUMMARY OF THE INVENTION

To solve the above and other problems, it is an object of the present invention to provide a functional film having excellent mechanical, optical and electrical properties by using a mixture of a nontoxic metal other than chromium and a dielectric material.

Additional objects and advantages of the invention will be set forth in part in the description which follows and, in part, will be obvious from the description, or may be learned by practice of the invention.

To accomplish the above and other objects, a functional film according to an embodiment of the invention includes a transition layer having a first constituent and a second constituent having gradual content gradients varying according to a thickness of the functional film, the first constituent being at least one dielectric material selected from the group consisting of $SiO_x$ (x>1), $MgF_2$, $CaF_2$, $Al_2O_3$, $SnO_2$, $In_2O_3$ and indium tin oxide (ITO), and the second constituent being at least one material selected from the group consisting of iron (Fe), cobalt (Co), titanium (Ti), vanadium (V), aluminium (Al), silver (Ag), silicon (Si), germanium (Ge), yttrium (Y), zinc (Zn), zirconium (Zr), tungsten (W) and tantalum (Ta).

According to an aspect of the invention, the gradual content gradients are distributed such that a refractive index gradually increases or decreases in an incident direction of external light according to the thickness of the functional film.

According to another aspect of the invention, the gradual content gradients are distributed such that a light absorption efficiency gradually increases in the incident direction of the external light according to the thickness of the functional film.

According to still another aspect of the invention, the gradual content gradients are distributed such that an electrical conductivity gradually increases or decreases by varying a content of the second constituent according to the thickness of the functional film.

According to yet another aspect of the invention, the gradual content gradients are distributed such that a content of the first constituent gradually decreases and the content of the second constituent gradually increases in the incident direction of the external light according to the thickness of the functional film.

According to another embodiment of the present invention, the functional film is deposited on a substrate having a refractive index difference of less than or equal to 0.5 at an interface between the substrate and the functional film.

According to still another embodiment of the present invention, the functional film further includes a dielectric layer formed of at least one dielectric material selected from the group consisting of $SiO_x$ (x>1), $MgF_2$, $CaF_2$, $Al_2O_3$, $SnO_2$, $In_2O_3$ and ITO.

According to a further aspect of the invention, the dielectric layer is deposited between the substrate and the transition layer and contacts the substrate.

According to a still further aspect of the invention, a difference in a refractive index between the dielectric layer and the substrate is less than or equal to 0.5.

According to a further embodiment of the present invention, the functional film further includes a conductive layer including at least one metal element selected from the group consisting of iron (Fe), cobalt (Co), titanium (Ti), vanadium (V), aluminium (Al), silver (Ag), germanium (Ge), yttrium (Y), zinc (Zn), zirconium (Zr), tungsten (W), and tantalum (Ta).

According to an additional aspect of the invention, the formation location of the conductive layer is formed on a face opposite an interface between the functional film and the substrate in the cases where the functional film is used in the fields requiring electrical conductivity characteristics, the second constituent is silicon, and the Si content increases according to the thickness of the film.

According to a still yet another embodiment of the present invention, the functional film further includes a dielectric layer and a conductive layer comprising at least one metal element selected from the group consisting of iron (Fe), cobalt (Co), titanium (Ti), vanadium (V), aluminium (Al), silver (Ag), germanium (Ge), yttrium (Y), zinc (Zn), zirconium (Zr), tungsten (W) and tantalum (Ta), where the conductive layer is formed at a face opposite the interface between the transition layer and the dielectric layer.

BRIEF DESCRIPTION OF THE DRAWINGS

The above objects and advantages of the present invention will become more apparent and more readily appreciated by describing in detail preferred embodiments thereof with reference to the accompanying drawings in which.

DETAILED DESCRIPTION OF THE PREFERRED EMBODIMENTS

Figure 1:
FIG. 1 is a schematic diagram illustrating the structure of a functional film according to an embodiment of the present invention.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

Figure 2:
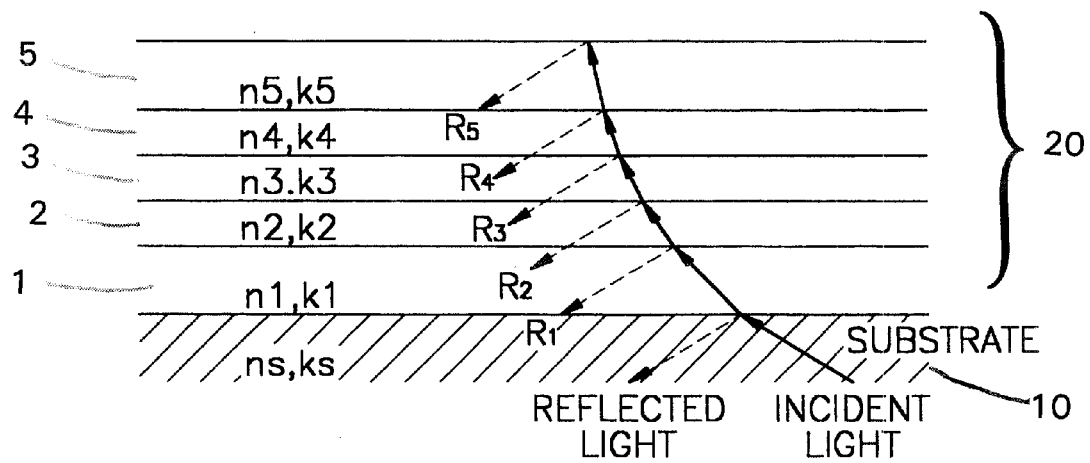
FIG. 2 is a diagram illustrating the principle of a functional film according to another embodiment of the present invention.

A functional film 20 according to an embodiment of the invention shown in FIGS. 1 and 2 includes a transition layer in which a first constituent and a second constituent have gradual content gradients according to a thickness of the functional film 20. The first constituent is at least one dielectric material selected from the group consisting of $SiO_x$ (x>1), $MgF_2$, $CaF_2$, $Al_2O_3$, $SnO_2$, $In_2O_3$ and indium tin oxide (ITO), and the second constituent is at least one material selected from the group consisting of iron (Fe), cobalt (Co), titanium (Ti), vanadium (V), aluminium (Al), silver (Ag), silicon (Si), germanium (Ge), yttrium (Y), zinc (Zn), zirconium (Zr), tungsten (W) and tantalum (Ta). The relative contents of the first and second constituents gradually vary by adjusting the rates at which the first constituent and the second constituent are deposited on a substrate 10 according to the thickness of the functional film 20, thereby providing the functional film 20 having gradients in view of refractive index, extinction coefficient and electrical conductivity. However, it is understood that other constituents and methods can be used. Further, while the functional film 20 is shown as only being a transition layer, it is understood that additional layers could be added in addition to the transition layer.

The reflectance of the film 20 is the square of the absolute value of a reflection coefficient (r) that is generally represented by formula (1):

$$r = \frac{N_s - N_f}{N_s + N_f} = \frac{(n_s - n_f) + i(k_s - k_f)}{(n_s + n_f) + i(k_s + k_f)} \tag{1}$$

wherein $N_s$ and $N_f$ denote complex refractive indices, $n_s$ and $n_f$ denote refractive indices and $k_s$ and $k_f$ denote extinction coefficients, of the substrate 10 and the film 20, respectively.

In order to reduce the reflectance of the film 20, a smaller difference in refractive index between the substrate 10 and the film 20 is more preferred. In other words, if the refractive indices of the substrate 10 and the film 20 become equal, no reflection occurs. A film 20 in which only absorption occurs and no reflection occurs can be obtained by gradually varying (increasing or decreasing) the refractive index in an increasing direction of the thickness of the film 20 above the substrate 10.

Based on the above-described principle, the functional film 20 shown in FIG. 2 includes first and second materials according to an embodiment of the present invention. The first material, which is a dielectric material whose refractive index is very similar to that of the substrate 10, is coated on a portion adjacent to the substrate 10. Here, it is assumed that the refractive index and the extinction coefficient of the substrate are $n_s$ and $k_s$, as noted above, and the refractive index and the extinction coefficient of the first material 1 are $n_1$ and $k_1$. Since there is little difference in the refractive index between the substrate 10 and the first material 1, the reflection of light can be almost avoided based on the principle represented by formula (1).

Then, a second material 2 (refractive index: $n_2$, extinction coefficient: $k_2$) having substantially the same refractive index as the first material 1 is deposited on the first material 1, thereby reducing the reflectance of the light based on the same principle as described above. Sequentially, a third material 3 having a refractive index of $n_3$ and an extinction coefficient of $k_3$, a fourth material 4 having a refractive index of $n_4$ and an extinction coefficient of $k_4$, a fifth material 5 having a refractive index of $n_5$ and an extinction coefficient of $k_5$, and so on, may be deposited based on the same principle as described above.

The gradient in the refractive index can be created such that the refractive index gradually increases or decreases. In order to reduce the reflectance of external light and to increase the light absorption efficiency, the deposition is preferably performed such that the extinction coefficient increases in the incident direction of the external light. By letting the extinction coefficient gradually increase according to the thickness of the film 20, the amount of the light passing through the film 20 can be made to gradually decrease until no light is transmitted when the thickness reaches a predetermined level.

Also, the electrical conductivity of the film 20 is made to gradually change by varying the content of the second constituent according to the thickness thereof, thereby maximizing the utilization efficiency of the film 20. In other words, if the content of the metal elements increases in the direction from a face contacting the substrate 10 to the opposite face according to the thickness of the film 20 to gradually increase the electrical conductivity, the reflectance of the external light is minimized to realize an optical structure having high electrical conductivity. Such a structure can effectively prevent charge accumulation when it is applied to an electromagnetic shielding material or black matrix of a display device.

$SiO_x$ (x>1), $MgF_2$, $CaF_2$, $Al_2O_3$, $SnO_2$, $In_2O_3$, and indium tin oxide (ITO), which are transparent, are preferably used as the dielectric material in the functional film 20 according to the present invention because they are similar to a general glass substrate 10 in view of the various properties including refractive index. Also, Fe, Co, Ti, V, Al, Ag, Si, Ge, Y, Zn, Zr, W and Ta are preferably used as the second constituent because of a high light absorption efficiency k. Specifically, Al and Ag are more preferred used because of their high electrical conductivity.

According to the present invention, the film 20 is deposited on a substrate 10 having a refractive index difference of less than or equal to 0.5 at the intersection of the film 20 and the substrate 10. If the difference is greater than 0.5, the reflectance of the film 20 undesirably increases as compared to the substrate 10, particularly a glass substrate 10.

Figure 5:
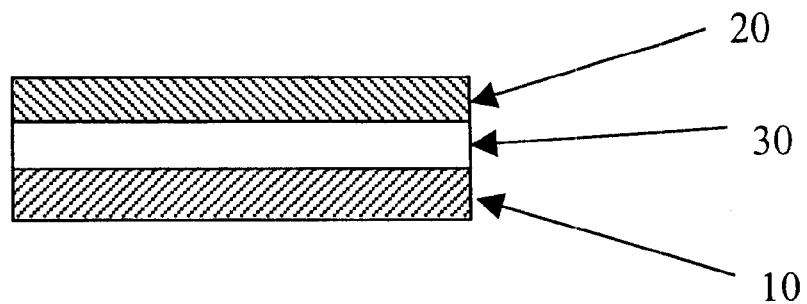
FIG. 5 is a schematic diagram illustrating the structure of a functional film including a dielectric layer according to a further embodiment of the present invention.

According to another embodiment of the present invention shown in FIG. 5, the functional film 20 may further include a dielectric layer 30 formed of the first constituent, which is a dielectric material. Here, the dielectric layer 30 is preferably between the substrate 10 and the transition layer of the film 20 such that it contacts the substrate 20. According to an aspect of the present invention, a difference in the refractive index between the dielectric layer 30 and the substrate 10 is preferably less than or equal to 0.5. If the difference is greater than 0.5, the reflectance of the film 20 undesirably increases as compared to the substrate 10, particularly a glass substrate 10.

Figure 6:
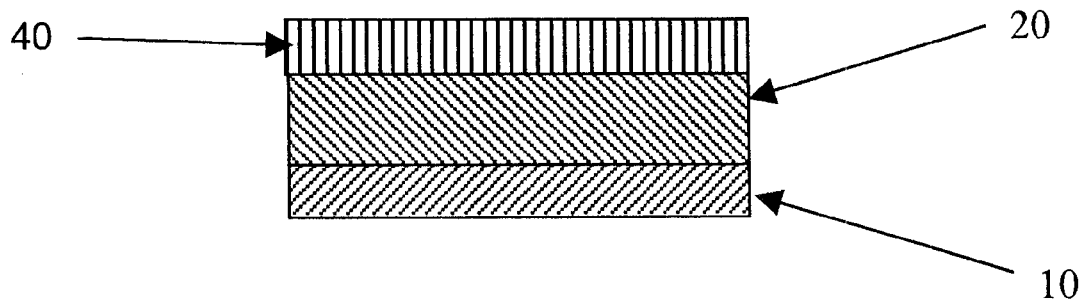
FIG. 6 is a schematic diagram illustrating the structure of a functional film including a conductive layer according to a yet further embodiment of the present invention.
Figure 7:
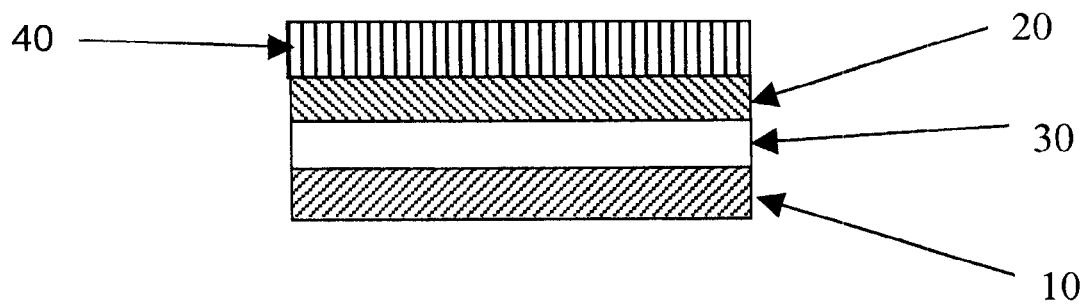
FIG. 7 is a schematic diagram illustrating the structure of a functional film including a dielectric layer and a conductive layer according to a still further embodiment of the present invention.

According to still another embodiment of the present invention shown in FIG. 6, the functional film 20 may further include a conductive layer 40 consisting of at least one metal constituent selected from the group consisting of Fe, Co, Ti, V, Al, Ag, Ge, Y, Zn, Zr, W and Ta. The formation location of the conductive layer 40 is not specifically restricted. However, in view of an improved resistance characteristic of the film 20, the conductive layer 40 is preferably formed on a face opposite the face where the film 20 contacts the substrate 10 in the cases where the functional film 20 is used in the fields requiring electrical conductivity characteristics, the second constituent is silicon, and the Si content increases according to the thickness of the film 20.

According to a further embodiment of the present invention, the functional film 20 includes a dielectric layer 30 and a conductive layer 40. The conductive layer 40 is preferably formed on a face opposite the face where the transition layer of the functional film 20 contacts the dielectric layer 30 in view of a low resistance characteristic of the functional film 20.

The functional film according to the present invention is manufactured using a general method of forming a thin film such as sputtering, vacuum deposition, PVD, CVD and so on. In an embodiment of the invention using sputtering, for example, the first constituent, which is a dielectric material, is subjected to RF magnetron sputtering and the second constituent, which contains metal elements, is subjected to RF or DC sputtering. A sputtering apparatus preferably includes a vacuum chamber equipped with a pumping system, a magnetron cathode positioned in the vacuum chamber, a target disposed on the magnetron cathode (e.g., the first or second constituent), and an argon gas inlet system for magnetron discharging. RF power is first applied to the first constituent having a dielectric material to initiate deposition of the first constituent on a substrate. The DC or RF power applied to the second constituent containing metal elements is gradually increased while gradually decreasing the RF power applied to the first constituent, thereby forming a functional film having relative content gradients of the first and second constituents on the substrate.

Figure 3:
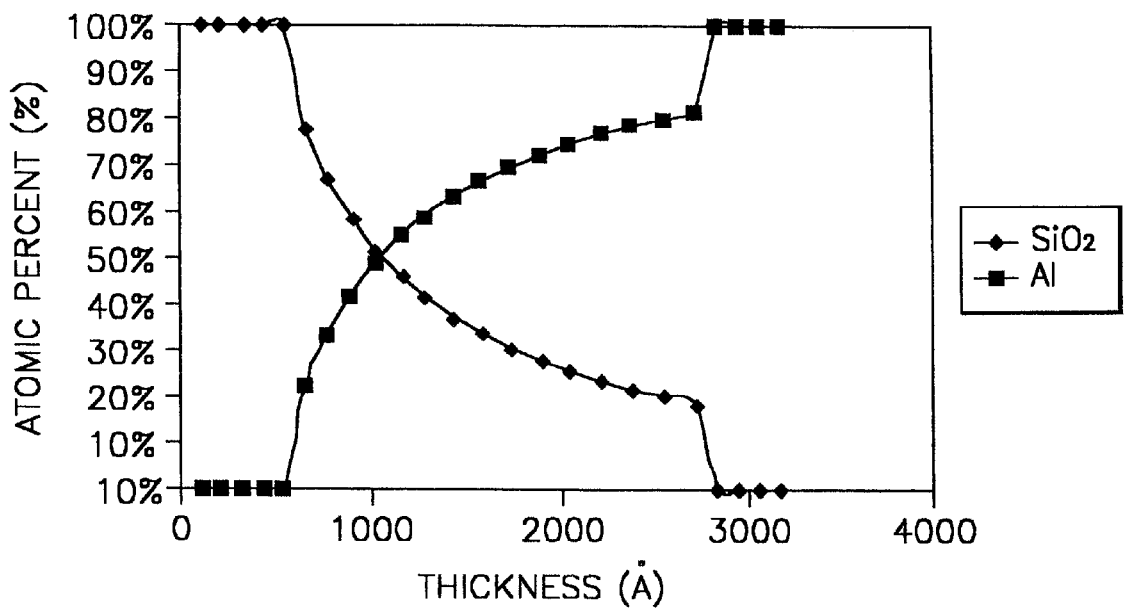
FIG. 3 is a diagram illustrating a change in the distribution of a first constituent ($SiO_2$) and a second constituent (Al) of a functional film according to yet another embodiment of the present invention.
Figure 4:
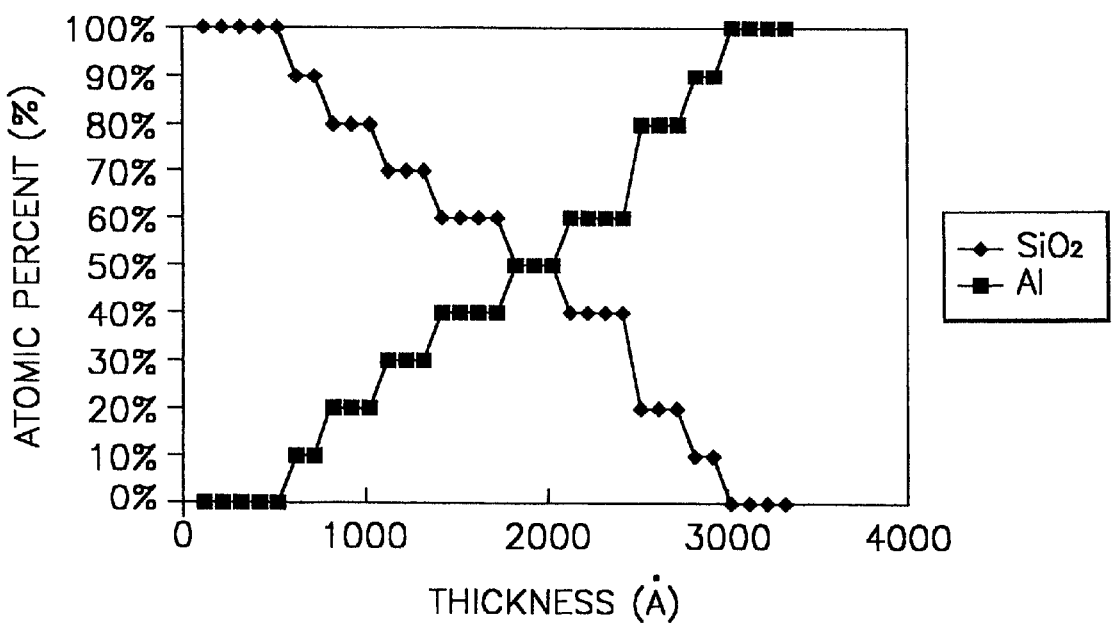
FIG. 4 is a diagram illustrating a change in the distribution of a first constituent ($SiO_2$) and a second constituent (Co) of a functional film according to still another embodiment of the present invention.

The functional film can be deposited such that the relative compositions of the first and second constituents vary linearly, but the present invention is not limited thereto. Alternatively, the deposition may be performed so that the relative compositions of the first and second constituents have stepped gradients. In other words, in the case of a linearly increasing or decreasing RF or DC power applied to the respective targets as shown in FIG. 3, a linear content gradients is created. Alternatively, as shown in FIG. 4, a functional film having a stepped gradient can be obtained by gradually applying predetermined RF or DC power to a target.

As described above, after performing the sputtering on the first and second constituents to thus manufacture the functional film according to the present invention, a subsequent process necessary according to the use of the functional film may be performed. For example, if a black matrix of a display device is intended to be manufactured, the functional film may be further patterned through a photolithography process.

The present invention will now be described in detail through the following examples, but it is not limited thereto.

EXAMPLE 1

Silicon dioxide ($SiO_2$) and silver (Ag) as targets were placed on a magnetron cathode using a sputtering apparatus while maintaining a base pressure at $5 \times 10^{-6}$ torr or less. $SiO_2$ was subjected to RF magnetron sputtering and Ag was subjected to DC magnetron sputtering. An Ar gas was injected and the degree of vacuum was maintained at 3.0 mtorr. Then, power was applied to the $SiO_2$ and the Ag targets so that the $SiO_2$ and the Ag were simultaneously deposited. In order to provide content gradients of the $SiO_2$ and the Ag, the power applied to the $SiO_2$ was gradually decreased and the power applied to the Ag was gradually increased. When the thickness of a $SiO_2$-Ag film became 2000-2500 Å, the power applied to the $SiO_2$ was turned off and only the Ag was deposited to a thickness of 1000 Å.

EXAMPLE 2

A functional film was manufactured in the same manner as in Example 1, except that Al was used as the second constituent instead of the Ag. The functional film manufactured by Example 2, as shown in FIG. 3, is distributed such that the contents of the first and second constituents vary linearly.

On the other hand, a functional film manufactured by Example 8, which will later be described, exhibits a compositional change having stepped gradients in the first and second constituents as shown in FIG. 4.

Referring to FIGS. 3 and 4, in the functional film formed on a soda-lime substrate, the content of the first constituent (SiO$_2$) gradually decreases according to the thickness from the face contacting the substrate to the opposite face (i.e., in the incident direction of external light), while the content of metal elements (Al or Co) gradually increases.

In the functional film having the above-described compositional distributions according to embodiments of the present invention, the dielectric material and the metal elements are slowly deposited so as to have inversely proportional content gradients. This process creates gradual gradients in view of the refractive index, the light absorption efficiency and the electrical conductivity without forming a laminated structure.

The refractive indices of the SiO$_2$ that forms a general substrate and a pure SiO$_2$ layer disposed on an area of the functional film contacting the substrate are exactly the same. Thus, the external light is not reflected at the interface between the substrate and the functional film, but is transmitted instead. Also, as the metal elements of the functional film increase, the refractive index and the light absorption efficiency gradually increase such that the external light is not reflected but is almost absorbed. Also, as the content of the metal elements gradually increases, the electrical conductivity of the functional film gradually increases accordingly such that a conductive layer consisting of only metal elements can be finally produced.

EXAMPLE 3

A functional film was manufactured in the same manner as in Example 1, except that Co was used as the second constituent.

EXAMPLE 4

A functional film was manufactured in the same manner as in Example 1, except that MgF$_2$ was used as the first constituent.

EXAMPLE 5

A functional film was manufactured in the same manner as in Example 1, except that CaF$_2$ was used as the first constituent.

EXAMPLE 6

A functional film having a stepped gradient, as shown in FIG. 4, was manufactured in the same manner as in Example 1, except that SiO$_2$ was used as the first constituent and Co was used as the second constituent.

The electrical and optical properties of the functional films manufactured in Examples 1 through 6 (i.e., the sheet resistance, the reflectance, the optical density and the thickness) were evaluated and the evaluation results are summarized in Table 1. In Table 1, the reflectance and the optical density were measured at a wavelength of 550 nm using a UV-visible ray spectrometer, and the sheet resistance Rs was measured by a 4-point probe method.

TABLE 1

| | Dielectric material/Metal | Rs (mΩ/□) | Reflectance (550 nm, %) | Optical density | Thickness (Å) |
|---|---|---|---|---|---|
| Example 1 | SiO$_2$/Ag | 227 | 0.5 | 4.6 | 3500 |
| Example 2 | SiO$_2$/Al | 680 | 0.3 | 4.1 | 3300 |
| Example 3 | SiO$_2$/Co | ~1000 | 0.5 | 4.36 | 3500 |
| Example 4 | CaF$_2$/Ag | 227 | 0.6 | 4.3 | 3300 |
| Example 5 | MgF$_2$/Ag | 240 | 0.5 | 4.0 | 3200 |
| Example 6 | SiO$_2$/Co | 630 | 0.5 | 4.2 | 3300 |

From Table 1, it was understood that the functional films according to Examples 1 through 6 had good reflectance, sheet resistance, and optical density, i.e., the functional films exhibited a sheet resistance of approximately 200 to approximately $10^9$ mΩ/□, a reflectance of 0.6 or less, and an optical density of 4.0 or greater.

In the functional film according to the present invention, in order to greatly reduce the reflectance of the film, the refractive index of the film can be easily adjusted to be substantially the same as that of a substrate. Also, while gradually varying the refractive index of the film as a function of film thickness, the film can be finally provided with desired electrical properties so that the film has both a light absorption layer and a conductive layer. Therefore, the functional film according to the present invention can be used for a variety of applications in which both optical properties and electrical properties are required.

While this invention has been particularly shown and described with reference to preferred embodiments thereof, it will be understood by those skilled in the art that various changes in form and details may be made therein without departing from the spirit and scope of the invention as defined by the accompanying claims and equivalents thereof.

What is claimed is:

1. A functional film comprising:
    a transition layer comprising
        a first constituent comprising at least one dielectric material selected from the group consisting of SiO$_x$, MgF$_2$, CaF$_2$, Al$_2$O$_3$, SnO$_2$, In$_2$O$_3$ and indium tin oxide, and
        a second constituent comprising at least one material selected from the group consisting of iron, cobalt, titanium, vanadium, aluminium, silver, silicon, germanium, Atrium, zinc, zirconium, tungsten and tantalum,
    wherein:
        the first and second constituents having corresponding gradual content gradients that vary according to a thickness of the functional film, and
        x is greater than 1.

2. The functional film according to claim 1, wherein the gradual content gradients are distributed such that a refractive index gradually increases or decreases in an incident direction of external light according to the thickness of the functional film.

3. The functional film according to claim 1, wherein the gradual content gradients are distributed such that a light absorption efficiency gradually increases in an incident direction of external light according to the thickness of the functional film.

4. The functional film according to claim 1, wherein the gradual content gradients are distributed such that an electrical conductivity gradually increases or decreases by varying a content of the second constituent according to the thickness of the functional film.

5. The functional film according to claim 1, wherein the gradual content gradients are distributed such that a content of the first constituent gradually decreases and a content of the second constituent gradually increases in an incident direction of external light according to the thickness of the functional film.

6. The functional film according to claim 1, further comprising a substrate on which the functional film is deposited, wherein a refractive index difference of less than or equal to 0.5 exists at an intersection of the functional film and said substrate.

7. The functional film according to claim 1, further comprising a dielectric layer formed of at least one dielectric material selected from the group consisting of $SiO_x$, $MgF_2$, $CaF_2$, $Al_2O_3$, $SnO_2$, $In_2O_3$ and indium tin oxide, wherein x is greater than 1.

8. The functional film according to claim 7, wherein said dielectric layer is deposited between said substrate and said transition layer so as to contact said substrate.

9. The functional film according to claim 8, wherein a difference in a refractive index between said dielectric layer and said substrate is less than or equal to 0.5.

10. The functional film according to claim 1, further comprising a conductive layer comprising at least one metal element selected from the group consisting of iron, cobalt, titanium, vanadium, aluminium, silver, germanium, yttrium, zinc, zirconium, tungsten and tantalum.

11. The functional film according to claim 10, further comprising a substrate, wherein said conductive layer is formed on a face of said transition layer opposite the face where said transition layer contacts said substrate.

12. The functional film according to claim 8, further comprising a conductive layer comprising at least one metal element selected from the group consisting of iron, cobalt, titanium, vanadium, aluminium, silver, germanium, yttrium, zinc, zirconium, tungsten and tantalum, wherein said conductive layer is formed at a face opposite to the face where said transition layer contacts said dielectric layer.

13. A functional film for use in a display, comprising:
   a first constituent comprising at least one dielectric material selected from the group consisting of $SiO_x$, $MgF_2$, $CaF_2$, $Al_2O_3$, $SnO_2$, $In_2O_3$ and indium tin oxide; and
   a second constituent comprising at least one material selected from the group consisting of iron, cobalt, titanium, vanadium, aluminium, silver, silicon, germanium, Atrium, zinc, zirconium, tungsten and tantalum,
   wherein:
      a relative content of said first and second constituents varies within the functional film such that light incident on a first face of the functional film is variably refracted and does not pass through a second face of the functional film opposite the first face, and
      x is greater than 1.

14. The function film of claim 13, wherein the relative content of said first and second constituents varies as a function of distance from the first face.

15. The functional film of claim 14, wherein the function is a linear function.

16. The functional film of claim 14, wherein the function is a step function so as to produce stepped gradients.

17. The functional film of claim 13, further comprising layers disposed between the first and second faces, with each said layer having a corresponding relative content of said first and second constituents that is constant through said layer.

18. The functional film of claim 13, wherein the first face has a refractive index that is at or within 0.5 of a refractive index of glass.

19. The functional film of claim 18, wherein the glass is soda-lime glass.

20. The functional film of claim 13, further comprising a conductive layer deposited on the functional film above the second face.

21. The functional film of claim 20, wherein said conductive layer comprises at least one metal element selected from the group consisting of iron, cobalt, titanium, vanadium, aluminium, silver, germanium, yttrium, zinc, zirconium, tungsten and tantalum.

22. The functional film of claim 13, further comprising a dielectric layer formed on the first face.

23. The functional film of claim 22, wherein:
   said dielectric layer comprises at least one dielectric material selected from the group consisting of $SiO_x$, $MgF_2$, $CaF_2$, $Al_2O_3$, $SnO_2$, $In_2O_3$ and indium tin oxide, and
   x is greater than 1.

24. The functional film of claim 23, further comprising a conductive layer deposited on the functional film above the second face, wherein said conductive layer comprises at least one metal element selected from the group consisting of iron, cobalt, titanium, vanadium, aluminium, silver, germanium, yttrium, zinc, zirconium, tungsten and tantalum.

25. The functional film of claim 13, wherein the functional film is a non-laminated structure having a refractive index that gradually changes as a function of a distance from the first face.

26. The functional film of claim 25, wherein a light absorption efficiency gradually increases as a function of the distance from the first face.

27. The functional film of claim 26, wherein an extinction coefficient gradually increases as a function of the distance from the first face.

28. The functional film according to claim 1, wherein the first constituent comprises at least one dielectric material selected from the group consisting of $SiO_x$, $MgF_2$, $Al_2O_3$, and indium tin oxide.

29. The functional film according to claim 1, wherein the second constituent comprises at least one material selected from the group consisting of cobalt, aluminium, silver, silicon, germanium, yttrium, zinc, zirconium, tungsten and tantalum.

30. The functional film according to claim 29, wherein the first constituent comprises at least one dielectric material selected from the group consisting of $SiO_x$, $MgF_2$, $Al_2O_3$, and indium tin oxide.

31. The function film of claim 13, wherein the first constituent comprises at least one dielectric material selected from the group consisting of $SiO_x$, $MgF_2$, $Al_2O_3$, and indium tin oxide.

32. The function film of claim 13, wherein the second constituent comprises at least one material selected from the group consisting of cobalt, aluminium, silver, silicon, germanium, yttrium, zinc, zirconium, tungsten, and tantalum.

33. The function film of claim 32, wherein the first constituent comprises at least one dielectric material selected from the group consisting of $SiO_x$, $MgF_2$, $Al_2O_3$, and indium tin oxide.

* * * * *